(12) United States Patent
Duda et al.

(10) Patent No.: US 10,843,235 B2
(45) Date of Patent: Nov. 24, 2020

(54) DEVICE FOR APPLYING A LIQUID MEDIUM WHICH IS EXPOSED TO UV RADIATION TO A SUBSTRATE

(71) Applicant: SUSS MicroTec Photomask Equipment GmbH & Co. KG, Sternenfels (DE)

(72) Inventors: Jörg Duda, Neulingen (DE); Uwe Dietze, Austin, TX (US)

(73) Assignee: SUSS MICRO TEC PHOTOMASK EQUIPMENT GMBH & CO KG, Sternenfels (DE)

( * ) Notice: Subject to any disclaimer, the term of this patent is extended or adjusted under 35 U.S.C. 154(b) by 175 days.

(21) Appl. No.: 15/752,614

(22) PCT Filed: Aug. 24, 2016

(86) PCT No.: PCT/EP2016/069986
§ 371 (c)(1),
(2) Date: Feb. 14, 2018

(87) PCT Pub. No.: WO2017/032804
PCT Pub. Date: Mar. 2, 2017

(65) Prior Publication Data
US 2018/0236501 A1    Aug. 23, 2018

(30) Foreign Application Priority Data
Aug. 27, 2015 (DE) .......................... 10 2015 011 177

(51) Int. Cl.
*B08B 3/10* (2006.01)
*H01L 21/67* (2006.01)
(Continued)

(52) U.S. Cl.
CPC .................. *B08B 3/10* (2013.01); *B05B 1/04* (2013.01); *B08B 3/08* (2013.01); *B08B 7/0057* (2013.01);
(Continued)

(58) Field of Classification Search
CPC ....... B08B 7/0057; B08B 3/10; B08B 7/0035; B08B 2203/005; B08B 3/08; H01L 21/6715; H01L 21/67051; G03F 1/82
See application file for complete search history.

(56) References Cited

U.S. PATENT DOCUMENTS 4,767,932 A * 8/1988 Ellner .................. A61L 2/10
250/435
2002/0000019 A1   1/2002 Park et al.
(Continued)

FOREIGN PATENT DOCUMENTS

JP          61194830       8/1986
JP         2001300451     10/2001
(Continued)

*Primary Examiner* — Michael E Barr
*Assistant Examiner* — Irina Graf
(74) *Attorney, Agent, or Firm* — Tarolli, Sundheim, Covell & Tummino LLP

(57) ABSTRACT

An apparatus for applying a liquid medium irradiated with UV radiation onto a substrata includes a housing having an elongated chamber, at least one inlet opening, and a slit shaped outlet opening opposite the inlet opening. A tube element extends through the chamber and is at least partially transparent to UV radiation. A flow space symmetric with respect to a longitudinal center plane of the chamber is formed between the tube element and a wall of the chamber. The longitudinal center plane dissects the outlet opening in its middle such that the tube element extends into the slit shaped outlet opening to form two longitudinally extending outlet slits between the tube element and the housing. At
(Continued)

least one UV-radiation source in the tube element is arranged to emit UV-radiation in the direction of the flow space and through the outlet slits.

19 Claims, 8 Drawing Sheets

(51) Int. Cl.
*B05B 1/04* (2006.01)
*G03F 1/82* (2012.01)
*B08B 7/00* (2006.01)
*B08B 3/08* (2006.01)

(52) U.S. Cl.
CPC ............ *G03F 1/82* (2013.01); *H01L 21/6715* (2013.01); *H01L 21/67051* (2013.01)

(56) References Cited

U.S. PATENT DOCUMENTS

| | | |
|---|---|---|
| 2002/0170674 A1 | 11/2002 | Shapiro |
| 2003/0044731 A1* | 3/2003 | Yoshihara ................ G03D 3/06 430/325 |
| 2004/0104049 A1 | 3/2004 | Ohnoda et al. |
| 2005/0229946 A1 | 10/2005 | Hirae et al. |
| 2012/0211024 A1 | 8/2012 | Dietze et al. |

FOREIGN PATENT DOCUMENTS

| | | |
|---|---|---|
| JP | 2004241726 | 8/2004 |
| JP | 2008043925 | 2/2008 |
| JP | 2008068155 | 3/2008 |
| JP | 2008108997 | 5/2008 |

* cited by examiner

Fig. 7
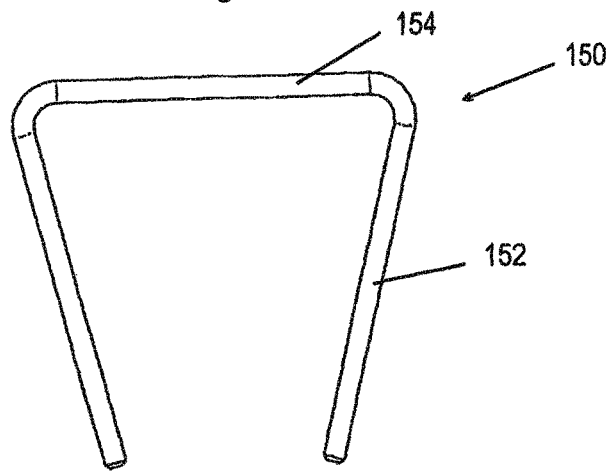
Fig. 8
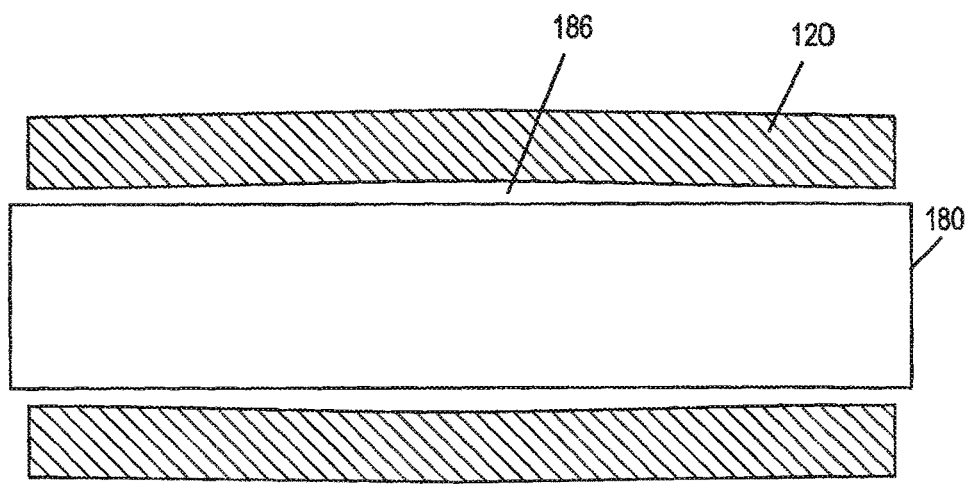
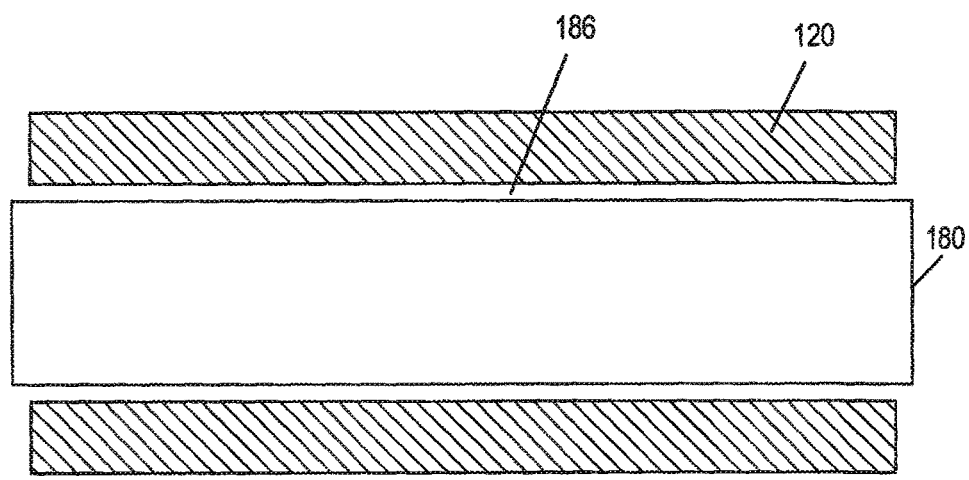

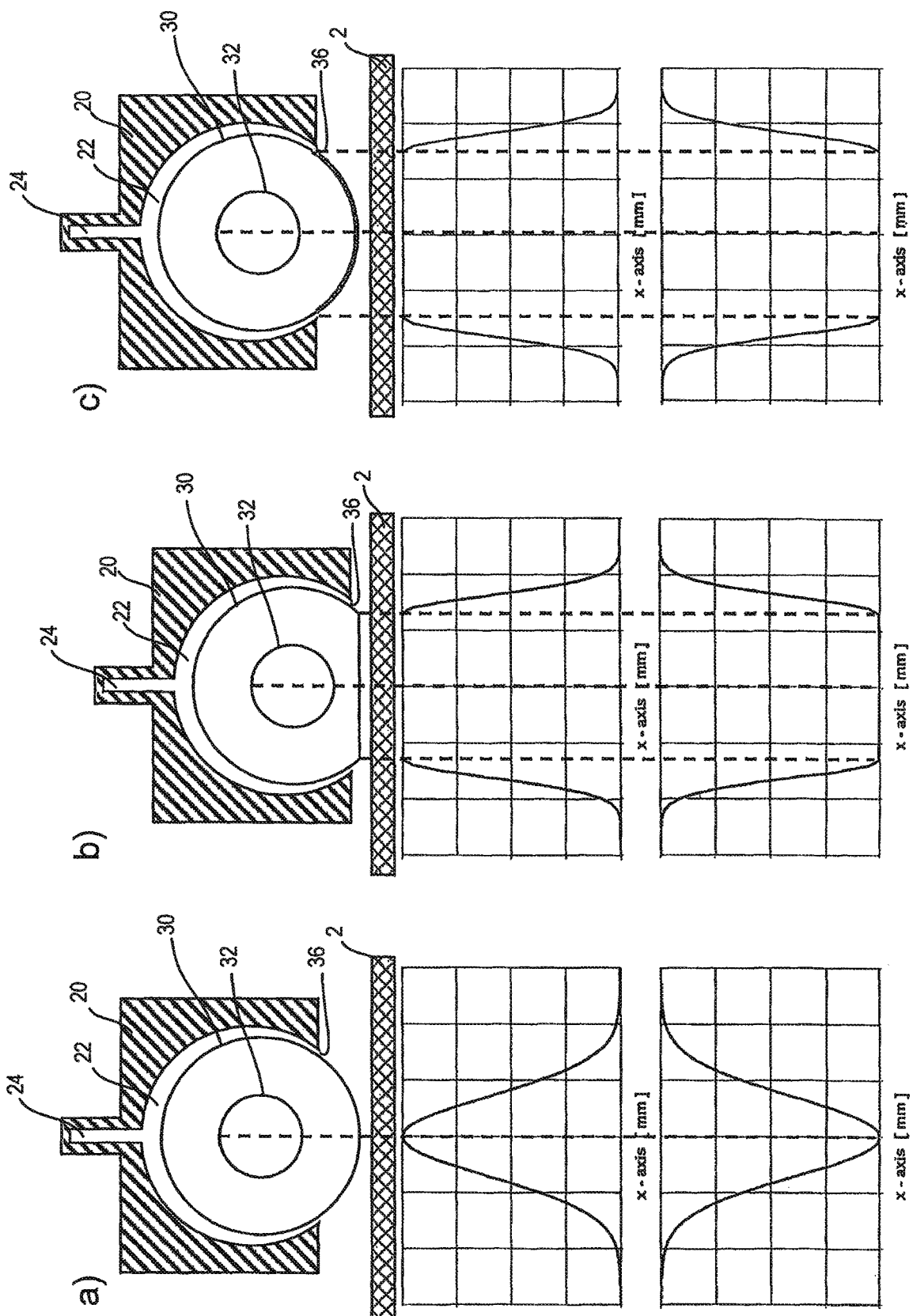

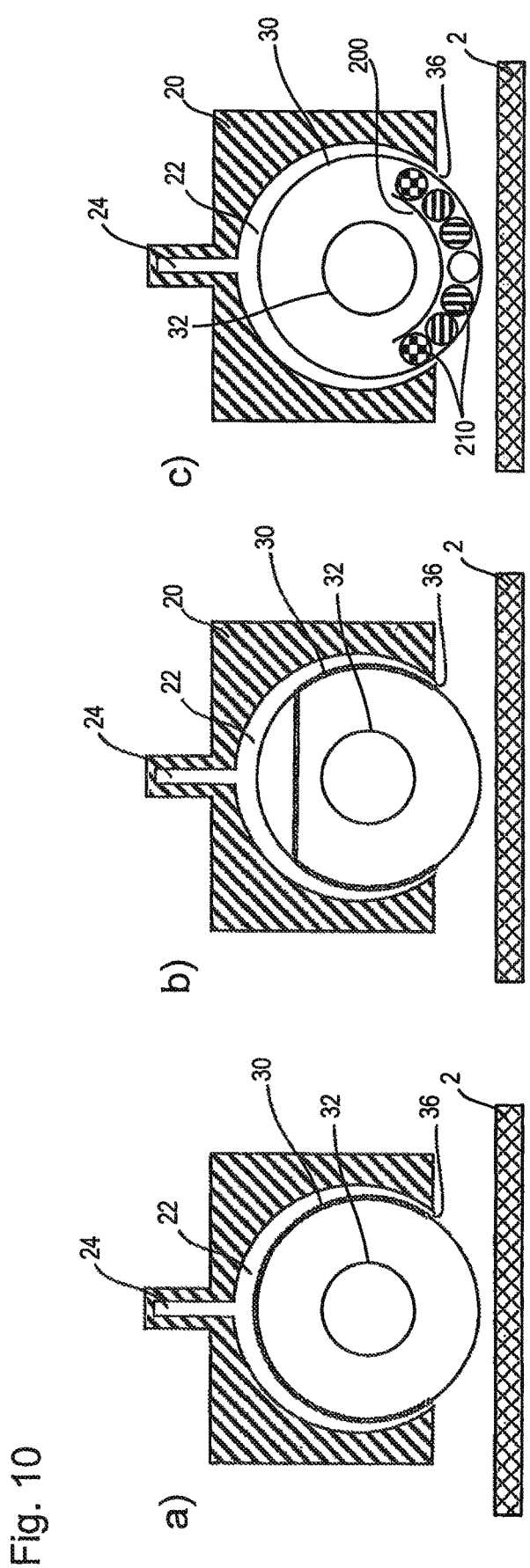

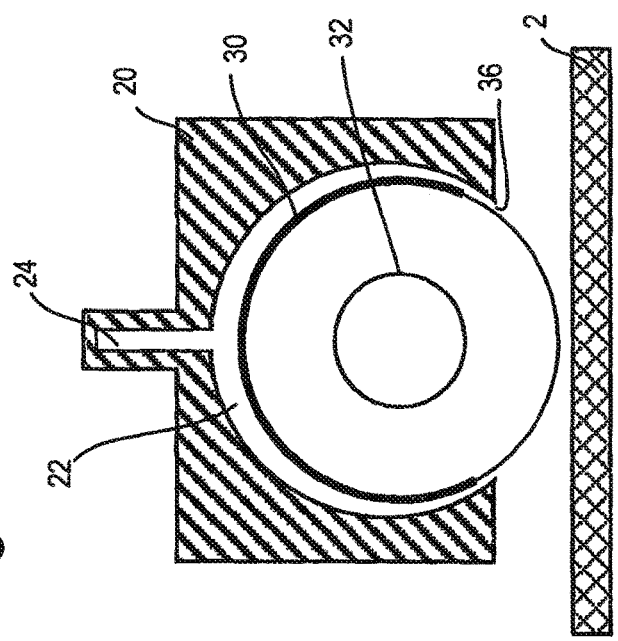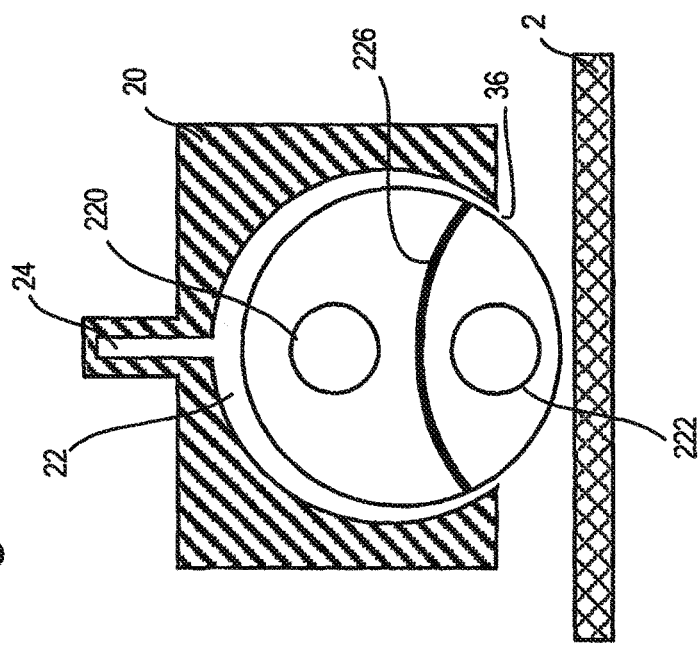

DEVICE FOR APPLYING A LIQUID MEDIUM WHICH IS EXPOSED TO UV RADIATION TO A SUBSTRATE

RELATED APPLICATIONS

This application corresponds to PCT/EP2018/069986, filed Aug. 24, 2016, which claims the benefit of German Application Mo. 10 2015 011 177.9, filed Aug. 27, 2015, the subject matter, of which are incorporated herein by reference in their entirety.

TECHNICAL FIELD

The present invention relates to an apparatus for applying a liquid medium irradiated with UV radiation onto a substrate in order to treat the substrate, wherein the liquid irradiated with UV radiation is locally applied in the region of the apparatus to the substrate and wherein UV radiation is continued to be introduced into the liquid.

BACKGROUND OF THE INVENTION

In semiconductor technology, it is known that for example photomasks have to be exposed to different treatment steps, in particular cleaning steps, both during their production and during their use. For example, it is known to expose the photomasks to a wet cleaning, in which at least locally a liquid film is formed on the substrate and UV radiation is introduced into this liquid film. Corresponding cleaning steps are also known for semiconductor wafers during their manufacture. In this case, the liquid and the UV radiation are matched such that a majority of the UV radiation is absorbed in the liquid film in order to generate radicals in the liquid film, which promote the cleaning. In particular, it is known to generate hydroxyl radicals in for example diluted hydrogen peroxide water or ozone water $O_3$—$H_2O$. Such hydroxyl radicals cause selective dissolution of organic materials from the substrate surface without harming metallic layers on the substrate surface if they are present. For a homogeneous treatment result, a homogeneous application of the liquid and a homogenous introduction of the UV radiation is desired.

An apparatus suitable for this purpose is, for example, known from German patent application DE 10 2009 058 962 A1 of the same applicant as the present application. In particular, the application shows an apparatus according to the preamble of claim 1.

SUMMARY OF THE INVENTION

In order to improve this apparatus, an apparatus according to the preamble of claim 1 further comprises the features of the characterizing portion of claim 1.

In particular, there is provided an apparatus for applying a liquid medium irradiated with UV radiation onto a substrate, the apparatus comprising: a housing having an elongated chamber, at least one inlet opening, which opens into the chamber, and at least one slit shaped outlet opening opposite the inlet opening, which extends over the length of the chamber, a tube element, which extends in a longitudinal direction through the chamber, the tube element being at least partially transparent to UV radiation, wherein the tube element is arranged in the chamber such that a flow space is formed between the tube element and the wall of the chamber, the flow space being symmetric with respect to a longitudinal center plane of the chamber, the longitudinal center plane dissecting the outlet opening in its middle, and such that the tube element extends into the slit shaped outlet opening in the housing and thereby forms two longitudinally extending outlet slits between the tube element and the housing, and at least one UV-radiation source in the tube element, which is arranged to emit UV-radiation in the direction of the flow space and through the outlet opening out of the housing. The apparatus is distinguished by the flow cross section of the flow space reducing from an area adjacent to the at least one inlet opening towards the outlet slits. Hereby, in use the liquid is accelerated as it flows towards the outlet slits, which lead to homogenization of the flow. In the region of the outlet slits, a homogeneous liquid curtain may be formed outside the housing, which may be applied to the substrate. Furthermore, by decreasing the flow cross section, a more homogeneous introduction of the UV radiation into the liquid may be achieved.

The flow cross section of the flow space may reduce steadily from the area adjacent to the at least one inlet opening to the outlet slits in order to avoid turbulences in the flow.

Preferably, the ratio of the flew cross section of the flow space in the area adjacent to the at least one inlet opening and at the outlet slits is in the range of 10:1 to 40:1 and preferably in the range of 15:1 to 25:1, to provide a respective acceleration of the liquid.

The flow chamber and the tube element may each have a substantially circular cross section and the center point of the tube element is offset with respect to the center point of the flow chamber in the direction of the outlet opening, in order to achieve the reduction in flow cross section in an easy manner. Here, substantially describes that the cross section is circular over an angular range of at least 250°. The outlet opening disrupts the circular cross section and also the tube element may for example have a lower flat portion.

In one embodiment, the housing has at least one media port, which is fluidly connected to a media distribution channel, wherein the media distribution channel extends adjacent to the chamber in a longitudinal direction within the housing and wherein the media distribution channel is fluidly connected to the chamber via a plurality of inlet openings. Preferably, the housing comprises a plurality of media ports, which are spaced in a longitudinal direction of the media distribution channel. The inlet openings are preferably evenly spaced in the longitudinal direction of the chamber and are preferably provided at the density in the range of 3/100 mm to 12/100 mm, in particular at the density of 4/100 mm to 10/100 mm. Such configurations may further support the homogeneity of the flow in the flow space.

For a good homogeneous flow distribution, the sum of the flow cross sections of the inlet openings is in substance equal to the sum of the flow cross sections of the outlet slits.

In accordance with a further embodiment, the apparatus comprises a plurality of spacer pins, which extend between the tube element and the wall of the chamber in order to set the width of the flow space in this area, and a plurality of biasing elements, which bias the wall of the chamber and thus the spacer pins to. Herby, a good adjustment of the flow space may be achieved, wherein the biasing elements counteract an outward deformation of the chamber, which could occur due to the fluid introduced into the chamber. The biasing elements in particular serve to keep the width of the outlet slits constant over the length of the outlet slits even during the application of liquid. Preferably, the spacer pins are each arranged along the flow path between the at least one inlet opening and the respective outlet slit in the last quarter thereof, and are in particular located adjacent to the outlet slits, to provide a respective adjustment here. Preferably, at least two biasing elements are provided which are arranged in the longitudinal direction of the chamber in the middle third, as here the danger for a deformation is highest. Respectively two of said plurality of spacer pins may be arranged in pairs symmetric with respect to the longitudinal center plane, wherein the spacer pins are preferably evenly spaced in the longitudinal direction. To avoid a deformation caused by the biasing elements, the biasing elements are arranged, transverse to the longitudinal extension of the chamber, in substance in the same plane as the spacer pins, wherein the term in substance defines a maximum deviation of up to $1/10^{th}$ of the distance between adjacent spacer pins.

BRIEF DESCRIPTION OF THE DRAWINGS

The invention will be explained in more detail herein below with reference to the drawings. In the drawings:

FIG. 7 shows a schematic front view of a clamping bracket;

FIGS. 8a and 8b show schematic horizontal sectional views, in the region of outlet slits of the apparatus according to the invention, which explain the effect of clamping brackets;

FIGS. 9a to 9c show schematic sectional views through different configurations of a radiation parts of the apparatus according to the invention, wherein FIG. 9a shows a normal configuration, and FIGS. 9b and 9c show alternative configurations;

FIGS. 10a to 10c show schematic sectional views of further alternative embodiments;

FIG. 11 shows a schematic sectional view through a further alternative configuration of the radiation part;

FIG. 12 shows a schematic sectional view similar to FIG. 11 of a further configuration of the radiation part.

DESCRIPTION

Directional references used in the following description, such as top or bottom, left or right, refer to the illustration in the figures and are not to be construed as limiting the application, although they may be preferred arrangements. In the following description, the term "bore" is to be understood as a longitudinally extending blind or through hole, which is independent of the manner of its manufacture, i.e. it does not have to be made by the process of drilling or boring, but can be manufactured in any suitable manner.

Figure 1:
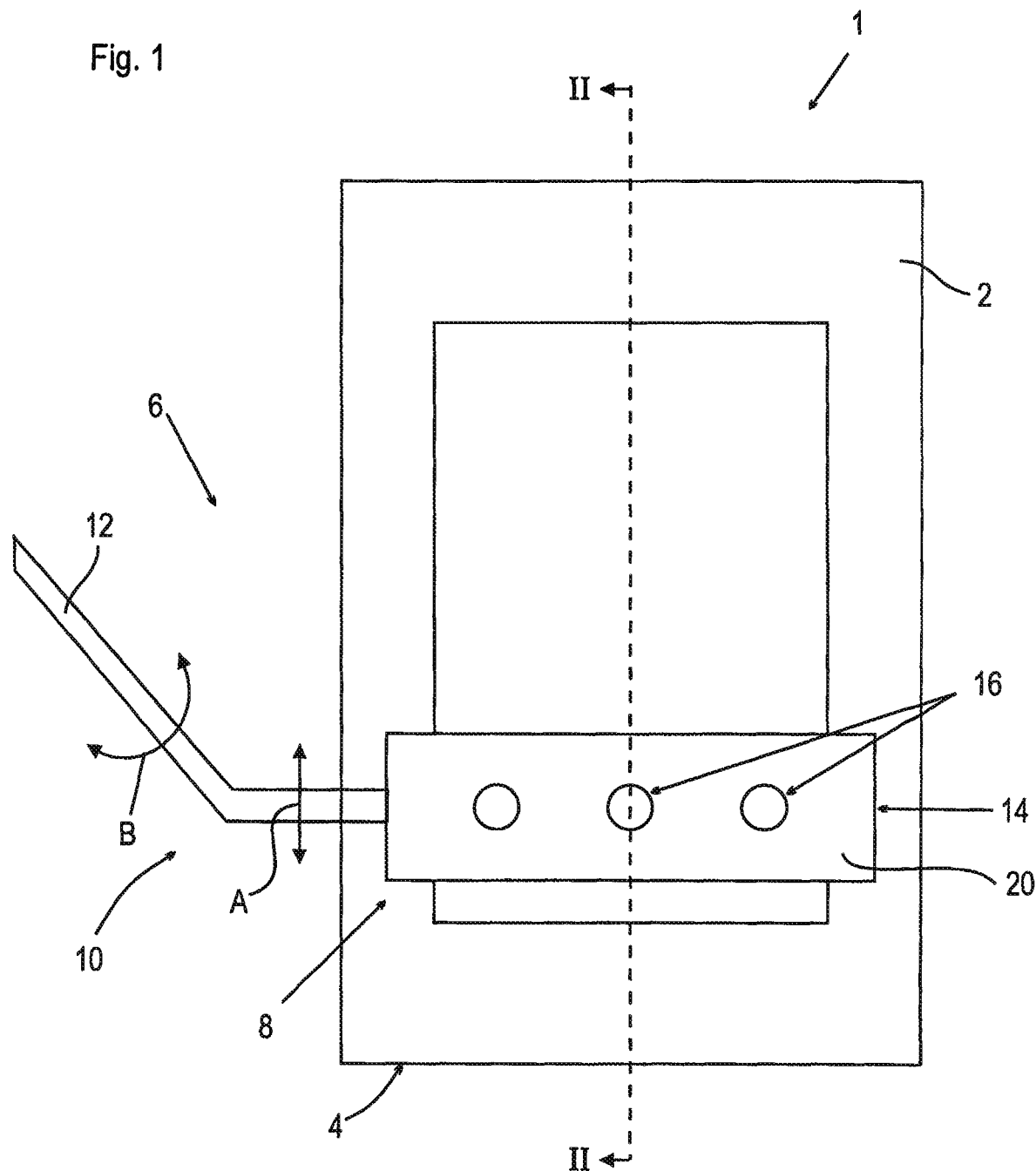
FIG. 1 shows a schematic top view of a substrate treatment apparatus having an apparatus according to the invention for applying a liquid medium irradiated with UV radiation onto a substrate.
Figure 2:
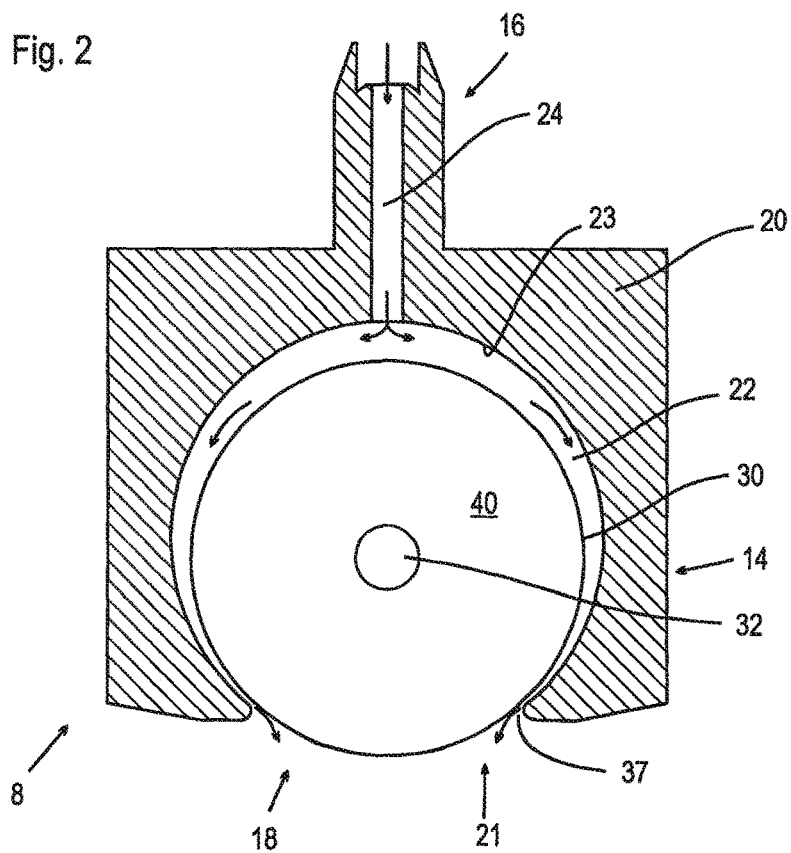
FIG. 2 shows a schematic sectional view of the apparatus according to the invention along the line II-II in FIG. 1.

FIG. 1 shows a schematic top view of an apparatus 1 for a UV radiation enhanced wet treatment of substrates 2, in particular masks or semiconductor wafers for the chip production, wherein the substrata may also be one of the following: a photomask for the production of semiconductor wafers, a semiconductor wafer, in particular a Si-wafer, a Ge-wafer, a GaAs-wafer, a InP-wafer, a flat panel substrate, and a multi-layer ceramic substrate. FIG. 2 shows a schematic sectional view of the apparatus 1 along the line II-II in FIG. 1. The apparatus 1 comprises in substance a substrate holder 4 and an application unit 6. The substrate holder 4 and the application unit 6 may be accommodated in a pressure chamber, not shown, in which by suitable means an overpressure or a negative pressure can be generated.

It should be noted that in a wet treatment, a liquid, such as, for example, diluted hydrogen peroxide water or ozone water $O_3H_2O$ or some other, in particular, water-containing liquid, is applied to the substrate. By irradiating the liquid with UV radiation, complex reactions occur and even if only water is used as a liquid, for example, 14 different species are generated, such as $H_2O$, $H^\bullet$, $HO^\bullet$, e-aq, $HO_2^\bullet$, $O_2^{\bullet -}$, $H_2$, $O_2$, $H_2O_2$, $H_2O^-$, $H_3O^+$, $HO^-$, $O_3^{\bullet -}$ and $HO_3^\bullet$. Such reactions in a liquid are much more complex and radicals have much shorter lifetimes than reactions occurring in gases irradiated with UV radiation, and therefore, a wet treatment apparatus is not readily comparable to a treatment apparatus using gases. The reactions are wavelength-dependent and the direction of the reaction towards one or another species may be influenced by wavelength selection.

The substrate holder 4 is, as indicated in FIG. 1, shown as a flat rectangular plate for receiving the also rectangular substrate 2. However, the substrate receptacle 4 can also assume different shapes and be matched to the shape of a substrate 2 to be treated. The substrate holder 4 has at least one drainage, not shown, for liquid media, which can be applied to the substrate 2 via the application unit 6.

The application unit 6 consists of a main part 8 and a support part 10, which carries the main part 8 in a movable manner, as indicated by the double arrows A and B. In particular, the support member 10 has a support arm 12 which is connected at one end to the main part 8 while the other end is connected to a drive unit, not shown. As shown by the double arrows A and B, the drive unit may, for example, provide at least one of a pivotal movement of the support arm 10 and thus the main part 8 and a linear movement. As a result, the main part 8 can be moved in the desired manner over a substrate 2 accommodated on the substrate holder 4 in order to allow treatment of partial areas of the substrata or also of the entire surface of the substrate. In addition, it is also possible for the support arm 10 to perform a lifting movement in order to be able to adjust a distance between the main part 8 and the surface of a substrate 2 received on the substrate holder 4.

Furthermore, it is alternatively or additionally possible to provide a movement mechanism for the substrate holder 4 in order to be able to provide a relative movement between the substrate 2 and the main part 8.

The main part 8 in substance made up of a housing 14, media ports 16 and a radiation part 18. The housing 14 has an elongated cuboid shaped body 20 made of a suitable plastic, such as TFM, a modified PTFE. The housing may also be made of another suitable material. The material should be selected so that it is resistant to the temperatures and media being used. A longitudinally extending chamber 22 which extends over the entire length of the body 20 is defined in the body. At the longitudinal ends of the body 20 cover elements, which are not shown may be attached in order to delimit the chamber 22 in the longitudinal direction. The body 20 and thus the chamber 22 have a length which is greater than a width dimension of the substrate 2 in order to be able to apply a liquid medium over the entire width of the substrate 2, as will be explained in more detail herein below. It is, however, also possible that the body 20 or the chamber 22 has smaller dimensions. The inner wall 23 of the chamber can be formed such that it has a high reflectivity, in particular for UV radiation, whereas IR radiation is essentially absorbed.

The chamber 22 has a substantially round cross-section, while the chamber 22 opens toward the lower face or bottom of the body 20, so that the body 20 defines a downwards (towards the substrate 2) facing opening 21. Consequently, the inner wall 23 of the chamber 22 in section only describes a partial circle, which is larger than a semicircle, and preferably extends over an angular range of 250° to 300°, in particular over 270° to 290°.

In the upper region of the chamber 22, at least one supply line 24, which is fluidly connected to the port 16, is provided in the body 20, the supply line 24 being arranged directly opposite the opening 21. The supply line 24 is fluidly connected to the chamber 22 in order to be able to conduct a liquid medium into the chamber 22, as will be explained in more detail herein below.

In the plan view of FIG. 1, three ports 16 are shown, which can each be fluidly connected to the chamber 22 via a respective supply line 24. However, a larger or smaller number of ports can also be provided. Via the ports 16, a single liquid medium can be conducted into the chamber 22, or several media can be conducted into the chamber 22, which can be introduced simultaneously or sequentially. In particular, it is possible to connect different media sources to the ports 16, via which, for example, different media can be conducted simultaneously to the respective ports 16 in order to produce an in-situ mixture. In particular, liquids are considered for the media, but gases may also be supplied which, for example, are mixed with a liquid in the port 16 and the supply line 24 before they are introduced into the chamber 22.

The radiation part 18 is substance formed by a tube element 30 and at least one radiation source 32. The tube element 30 has an elongated shape and extends over the entire length of the chamber 22 and may extend through (or into) the cover members, not shown, at the ends of the body 20. The tube element 30 is made of a material which is substantially transparent to UV radiation and has a round cross-section. The center point of the tube element 30 having the round cross-section is offset with respect to the center point of the partial circle formed by the inner wall 23 of the chamber 22 in the direction of the opening 21. The tube element 30 extends partially through the opening 21 out of the housing 14, as shown in FIG. 2.

Thus, a flow space is formed between the tube element 30 and the inner wall 23 of the chamber 22. The flow space is symmetrical with respect to a longitudinal center plane C of the chamber 22 (see line IV-IV in FIG. 3) which centrally intersects the outlet opening 21 and the supply line 24. The flew space forms right and left branches, as shown in the cross-sectional view in FIG. 2. Each of the branches has at the lower end thereof an outlet slit 37, which is formed between the tube element 30 and the respective end of the inner wall 23 in the region of the opening 21. Starting from the supply line 24 and extending towards the respective outlet slit 37, each of the branches of the flow space has a tapering flow cross-section. In particular, the flow cross-section of the flow space in each branch continuously tapers in the direction of the respective outlet slit 37. The ratio of the flow cross section of the flow space in the area adjacent to the at least one supply line 24 and at the outlet slits 37 is in the range from 10:1 to 40:1 and preferably in the range from 15:1 to 25:1. Media flowing in the direction of the outlet slits 37 are therefore significantly accelerated. A respective acceleration of the media leads on the one hand to a homogenization of the flow and on the other hand to high flow velocities at the outlet slits 37. The high flow velocities promote the formation of a substantially continuous curtain of the liquid medium below the opening 21 which can be used to form a liquid film on a substrate 2 disposed thereunder.

In FIG. 2 flow arrows are indicated, which show a flow of a liquid medium from the port 18 via the supply line 24 and the chamber 22 out of the housing 14.

The radiation source 32 is—in the illustrated configuration—a rod-shaped lamp, which is arranged centrally within the tube element 30. The rod-shaped lamp 32 again extends over the entire length of the chamber 22 to provide a uniform distribution of radiation over the length of the chamber 22. The radiation source 32 primarily emits UV radiation in a desired spectral range, wherein the emitted radiation is emitted both into the flow space of the chamber 22 and through the opening 21 out of the housing 14. The radiation may be specifically selected for a specific purpose, as will be explained in more detail below. The radiation can also be controlled such that radiation emitted into the flow space is different to radiation emitted out of the opening 21.

Instead of or in addition to such a tubular radiation source, other radiation sources may also be provided, as shown in part in subsequent embodiments. In particular, more than one radiation source 32 can be provided within the tube element 30. For example, gas discharge lamps, but also LEDs or other suitable light sources which emit in a desired spectral range (at least also in the UV range) can be used as the radiation source 32.

The space 40 which is formed between the tube element 30 and the radiation source 32 can be supplied with a cooling medium, in particular a gaseous cooling medium to prevent overheating of the elements. In this case, the cooling medium is to be chosen so that it absorbs substantially no UV radiation.

A further embodiment of an application unit 6, in particular an alternative main part 108, which can be used in the device according to FIG. 1, will now be described with reference to FIGS. 3 to 8. The main part 108 has in substance a housing 114, a media guide 116 and a radiation part 118.

The housing 114 again has an elongated, cuboid shaped body 120 of a suitable material (such as TFM) having a longitudinally extending chamber 122 which extends over the entire length of the body 120. At the longitudinal ends of the body 120 covering elements (not shown) may be attached for delimiting the chamber 122 in the longitudinal direction. The covering elements may for example be attached by screws, which provides a releasable connection. However, other ways of connecting the covering elements, which are preferably releasable may be used instead. The chamber 122 may again have a length which is greater than a width dimension of a substrate 2, onto which a liquid medium is to be applied.

Again, the chamber 122 has a substantially circular cross-section, with the chamber 122 opening to a lower face or bottom 124 of the body 120 so as to define a downwardly facing opening 121. An inner wall 123 of the chamber 122 thus again describes a partial circle, which, however, is larger than a semicircle. The opening angle of the opening 121 is preferably in a range between 60° and 120°, ad is in particular between 70° and 90°.

The bottom 124 of the body 120 is configured to form a slope inclined upwards towards sidewalls 128 of the body 120. Between the slope and the opening 121, a substantially planar area is formed, and directly adjacent to the opening 121, the body 120 has a round edge 126. This round edge connects the substantially planar portion of the bottom 124 with the circular inner wall 123 of the chamber 122 and at its apex defines the actual opening 121 in the body 120.

In the transition region between the bottom 124 and side walls 128 of the body 120 a plurality of oblique recesses (e.g. 5 on each side, as shown) is provided. In the region of each of these recesses 130, the body 120 has a through-bore 132 to the chamber 122. The through hole 132 is stepped and has a wider region facing the recess 130 and a narrower region facing the chamber 122. In the wider region facing the recess 130, the through-bore 132 is provided with an internal thread. The respective through-bore 132 serves to receive an adjusting element 134, which has a stepped shape corresponding to the stepped shape of the through-bore 132. The adjusting element 134 has a head part 136 and an adjustment part 133. The head portion 136 is sized to pass through the narrow region of the through-bore 132 so as to be able to protrude into the chamber 122. The adjustment part 138 has an external thread engageable with the internal thread in the wider region of the through-bore 132 to be screwed therein. In this case, the depth of engagement of the adjustment part 138 determines how far the head part 136 of the adjusting element 134 projects into the chamber 122. The adjusting element 134 is made of a suitable material that is resistant to the temperatures and the media used and may have some resiliency. In particular, a PFA material (polyfluoroalkoxyl polymer material) has proven to be suitable. However, also other materials, in particular other plastic materials may be used.

A top side 140 of the body 120 has a plurality of recesses 142 extending transversely to the longitudinal direction of the body 120, which are aligned with the recesses 130 in the longitudinal direction of the body 120. In the area of each recess 142, a further recess 144 and a threaded bore 146 are provided. The threaded bore 146 serves to receive a screw, via which a cover plate 147 can be attached to fill the recess 142.

The recess 144 has a first section which extends at the bottom of the recess 142 transversely to the longitudinal direction of the body 120. The recess 144 further has sections extending directly adjacent to the respective side walls 128 in a direction parallel to the side walls 123 into body 120. The recess 144 thus forms in substance a U-shape, as best seen in FIG. 3.

Figure 3:
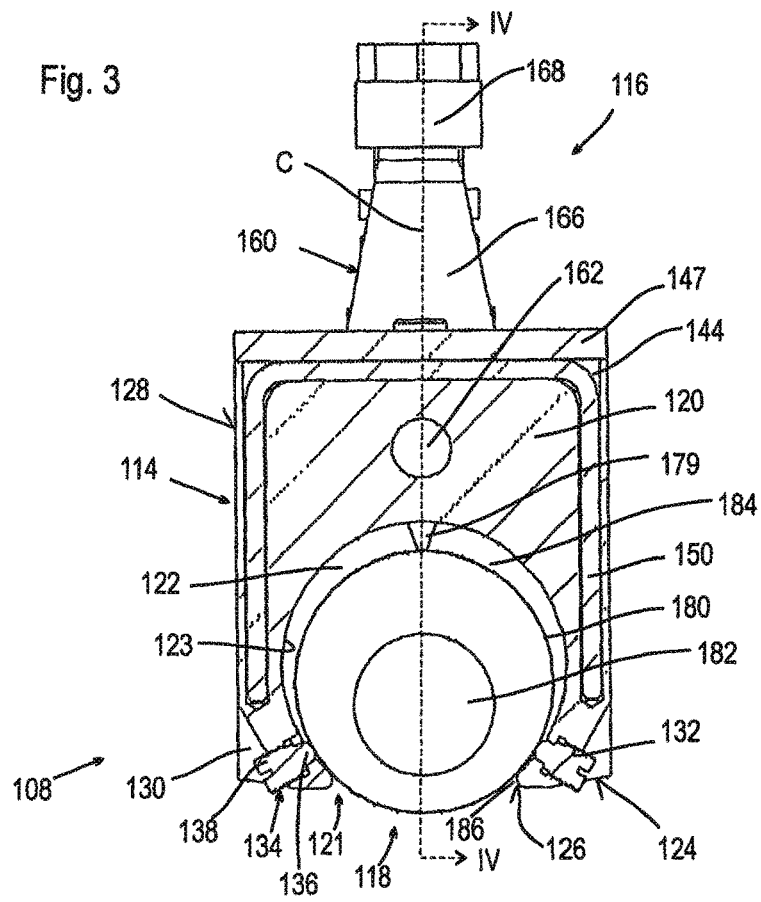
FIG. 3 shows a schematic sectional view taken along the line III-III in FIG. 4, which is similar to FIG. 2 but shows an alternative embodiment.

The recess 144 serves to receive a clamping element 150, as best seen in FIG. 3. FIG. 7 show a perspective view of the clamp member 150 in a non-installed and thus relaxed state. The clamping element 150 has in substance a U-shape, wherein (in the relaxed state) legs 152 of the U-shaped clamp member 150 extend from a base portion 154 of the clamp member 150 towards each other without touching each other. In other words, the distance between the free ends of the legs 152 is smaller than the distance of the legs at the base portion 154. Thus, when the legs 152 of the clamping element 150 are inserted into the U-shaped recess 144, they must be slightly bent apart and they then exert an inwardly directed bias onto the portion of the body 120 adjacent the legs. In particular, an inwardly directed bias is provided in the region of the adjusting elements 134.

The aforementioned media guide 116 is integrally formed in the body 120, and will be explained in more detail herein below. The media guide 116 is essentially divided into supply elements 160, a media distribution channel 162 and inlet channels 164.

In the illustrated embodiment, four supply elements 160 are provided, which are spaced apart in the longitudinal direction of the body 120. The supply elements 160 are not uniformly spaced. Rather, the distance between the middle supply elements 160 is smaller than the distance to their respective outer supply elements 160. The supply elements 160 are each formed on the top surface 140 of the body 120 and each have substantially a frusto-conical portion 166 extending upwardly from the top surface 140. Above the frusto-conical portion 166, there is provided an annular port 168 suitably adapted for connection to an external supply line. In the frusto-conical portion 166, a vertically extending through-bore 170 is formed. The through-bore extends completely through the frusto-conical portion 166 of the supply element 160 into the media distribution channel 162, which will be explained in more detail herein below.

The media distribution channel 162 is formed by a longitudinal bore 174 located centrally in the transverse direction of the body 120. The longitudinal bore 174 extends completely through the body 120 and is disposed between the top 140 surface and the chamber 122. In the end regions, the longitudinal bore 174 has widened sections 176, which can be closed by suitable end caps, not shown. The actual media distribution channel 162 is formed only by the central, unclosed portion of the longitudinal bore 174. Of course, as one skilled in the art will appreciate, it would also be possible for the longitudinal bore 174 to open only toward one end of the body 120 and thus has a widened section 176 only at this end, which can be closed in a suitable manner.

Figure 4:
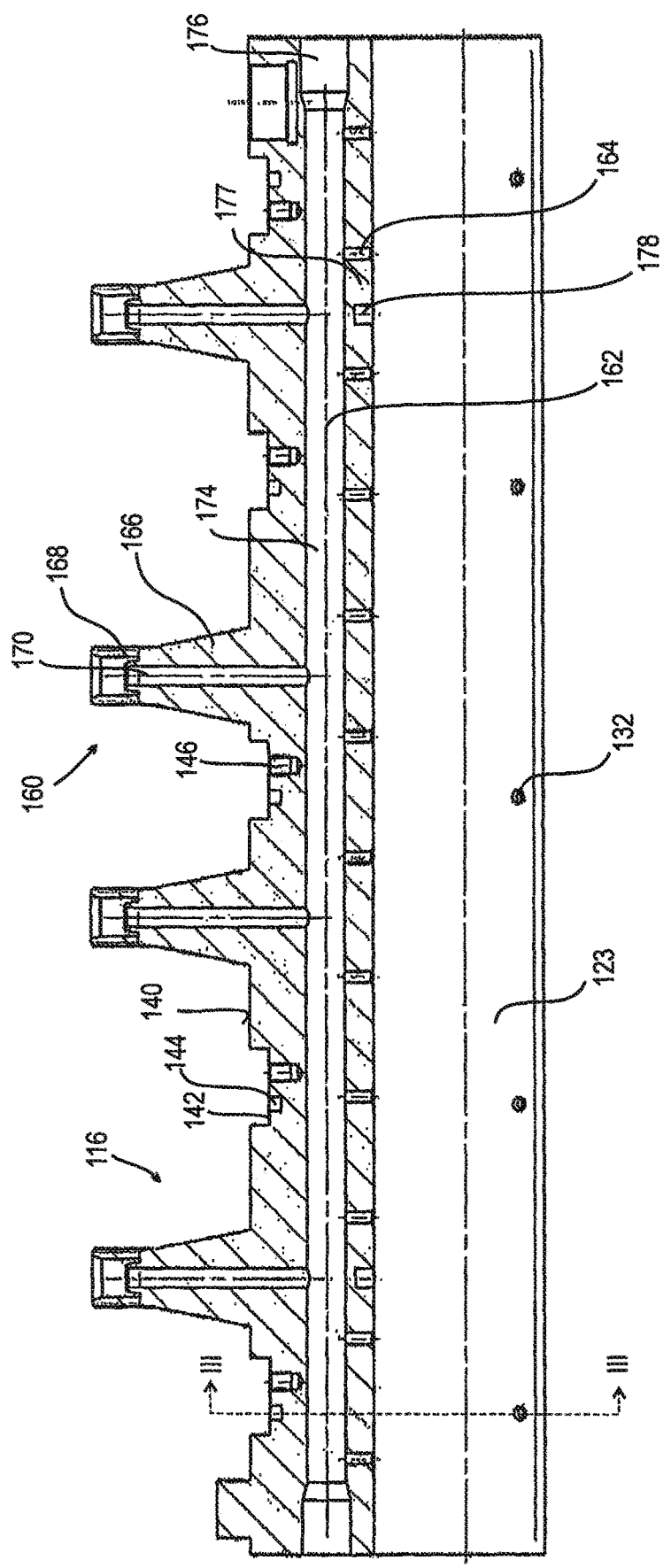
FIG. 4 shows a schematic longitudinal sectional view of a housing of the alternative embodiment of the invention shown in FIG. 3 along the line IV-IV in FIG. 3.
Figure 5:
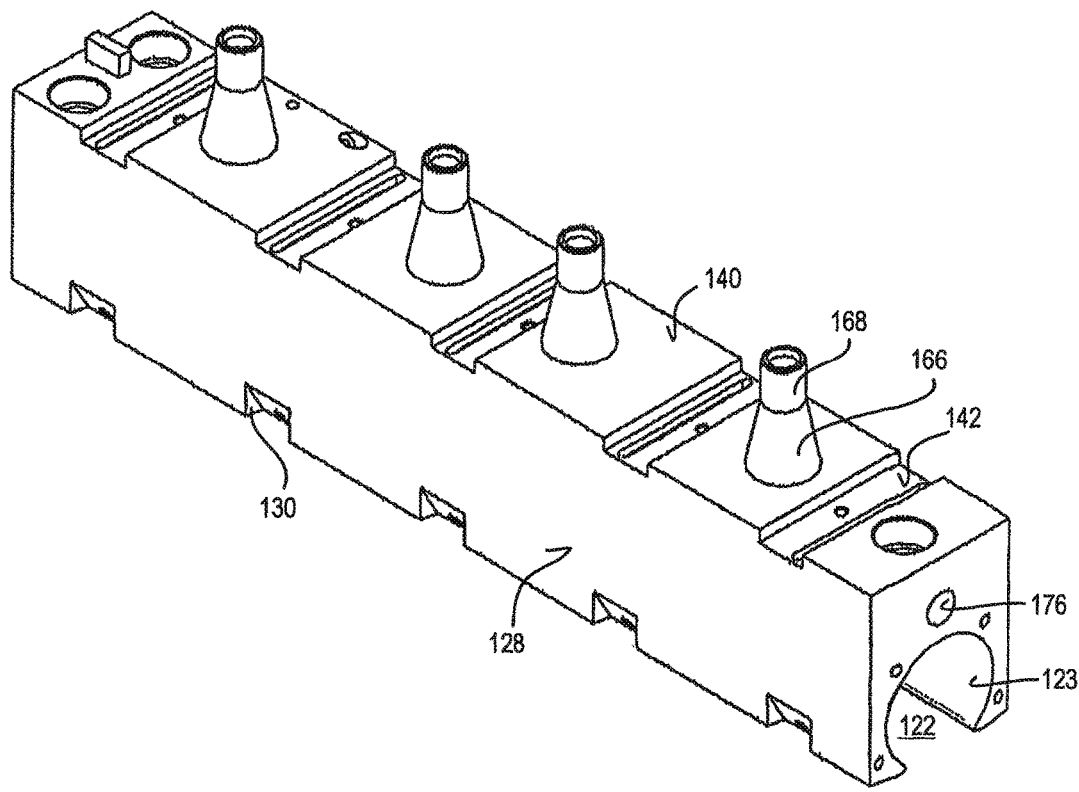
FIG. 5 shows a schematic perspective view of the housing of FIG. 4.
Figure 6:
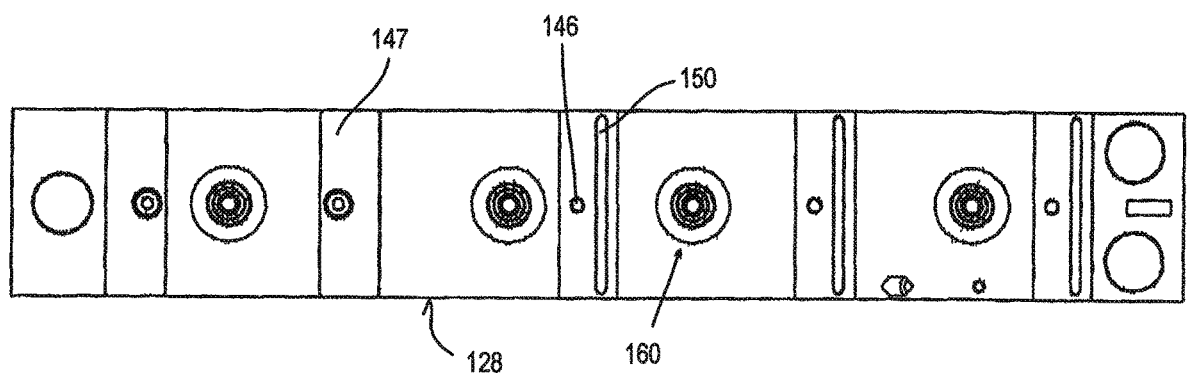
FIG. 6 shows a schematic top view of the housing of FIG. 4.

As can be seen in particular in FIG. 4, the longitudinal bore 174, which forms the media distribution channel 162, is in fluid communication with the bores 170 at four locations. Any medium introduced via the supply elements 160 can be introduced into the media distribution channel 162 at various locations and is then distributed in the longitudinal direction of the body 120 within the media distribution channel 162.

In a wall member 177 located between the media distribution channel 162 and the chamber 122, a plurality of through bores are formed, which fluidly connect the media distribution channel 162 and the chamber 122 and thus form the inlet channels 164. In the illustrated embodiment twelve inlet channels 164 are provided. The inlet channels 164 are arranged offset with respect to the bores 170 in the longitudinal direction of the body 120. Of course, a different number of inlet channels 164 may be provided. The inlet channels 164 are preferably evenly spaced in the longitudinal direction of the body 120, wherein a density in the range of $3/100$ mm to $12/100$ mm, in particular in the range of $4/100$ mm to $10/100$ mm is currently preferred to promote a homogeneous flow of media in the chamber 122.

In the side of the wall member 177 facing the chamber 122 two blind bores 178 (see FIG. 4) are provided, which each serve to receive a spacer 179 (see FIG. 3). The spacers 179 are made of a suitable material that is durable at the temperatures and the media used and has some resiliency. In particular, PFA can again be used here, as in the case of the adjusting elements 134. The spacers 179 each have a foot, not shown, to be received in a respective one of the blind bores 178 and a frusto-conical main part, which can be seen in FIG. 8.

The radiation part 118 of this embodiment will now be explained in more detail. The radiation part 118 has a tube element 180 and at least one radiation source 182. These have substantially the same structure as the tube element 30 and the at least one radiation source 32 according to the first embodiment. The tube element 180 has an elongated shape with a round cross section and is made of material that is substantially transparent to UV radiation. The tube element 180 is received in the chamber 122 so as to extend over the entire length thereof, and the center of the tube element 180, which has a round cross section, is offset with respect to the center of the partial circle of the inner wall 123 of the chamber 122 towards the opening 121. The round tube element 180 again extends partially through the opening 121 out of the housing 14. Again, a flow space 184 is formed between the tube element 180 and the inner wall 123 of the chamber 122, the flow space 184 being symmetrical with respect to a longitudinal center plane C of the chamber 122 which centrally intersects the opening 121 and the supply elements 160. The flow space 184 forms a right and a left branch, as can be seen in the cross-sectional view of FIG. 3. Each of the branches has an exit slit 186 at its lower end. Starting from the inlet channels 164 to the respective outlet slit 186, each of the branches of the flow chamber has a tapering flow cross-section. The branches taper in the same manner as in the first embodiment.

As can be seen in the view according to FIG. 3, the tube element 180 rests on the heads 136 of the respective adjusting elements 134, and contacts the spacers 179 on its upper side. The adjusting elements 134 and the spacers 179 thus provide a 3-point contact and thus define the exact position of the tube element 180 in the chamber 122. As can be seen, the width of the outlet slits 186 can be adjusted to a certain extent by the adjusting elements 134. The respective heads 136 of the adjusting elements 134 form point supports which do not substantially affect a flow of a medium around the heads, so that a substantially continuous media curtain can be formed in the region of the outlet slits 136. The radiation source 132 may be placed within the tube member 180 in the same manner as in the first embodiment.

The main difference between the embodiment of the main part 8 according to FIG. 2 and the second embodiment of the main part 108 according to FIGS. 3 to 7 is in the region of the media guide. While in the first embodiment a medium is introduced directly into the chamber 122 via the supply lines 24, in the second embodiment this occurs via the supply elements 160 into the media distribution channel 162 and then via the inlet channels 164 into the chamber 122. As a result, a more uniform distribution of the liquid medium in the longitudinal direction of the body 120 is achieved. In the region of the chamber 122, a more uniform flow is thus provided in the flow space 184. In particular, in combination with the tapering cross section of the flow space 184, a uniform flow can be achieved at the exit slits 186 to form a uniform liquid curtain.

Another difference is the use of the brackets 150, the adjusting elements 134 and the spacers 179, which, however, can also be used in a corresponding manner in the first embodiment. The clamps 150 function to provide an inwardly directed bias in the region of the chamber 122, as will be explained in more detail with reference to FIGS. 6a and 8b.

When a liquid medium is introduced into the chamber 122 via the media guide 116, an outwardly directed pressure is generated on the inner walls 123 of the chamber. In particular in the widest region of the chamber 122, where the body 120 has a small cross-section, a respective pressure can lead to a deformation of the body 120 such that the width at the outlet slits 186 may increase. This applies, in particular, to a middle region in the longitudinal direction of the body 120, since at the ends the cover members (not shown) would counteract a respective deformation.

In particular, as is shown in FIG. 8a, for example the width of the outlet slit 186 could increase substantially in the central region, which would of course change a respective media outflow from the outlet slit 186. This would counteract a uniform distribution of media. By using the brackets 150, this can be prevented, as shown in FIG. 8b. The brackets 150, particularly in combination with the adjusting elements 134, can ensure uniform widths of the outlet slits 186. The brackets 150, in particular in combination with the adjusting elements 134 may also be advantageous, independently of a change in a flow cross-section of the flow chamber, in order to ensure a constant width of the outlet slits 186.

Different configurations of the radiation part 18 of the first embodiment will now be explained in more detail with reference to FIGS. 9 to 12. However, these configurations can be used in the same way in the second embodiment.

FIG. 9a shows a normal configuration similar to FIG. 2, having a tube element 30, which has a round cross-section, and a rod-shaped radiation source 32 arranged centrally in the tuba element 30. Where appropriate, the same reference numerals are used in the following as in the first embodiment, wherein the different configurations can of course also be used in the second embodiment.

The housing 14 with chamber 22 and supply line 24 is indicated only schematically. Below this unit, a substrate 2 is shown schematically.

Below the schematic representation of the different configuration, two graphs are shown, wherein the upper graph represents a distribution of the concentration of radicals on the surface of the substrate 2 when a liquid medium, such as $H_2O_2$, is supplied to the substrate via the supply line 24 while the radiation source 32 is operated. The lower graph indicates the achievable change of a lacquer layer thickness on the substrate in a cleaning process promoted by the radicals, wherein here a stationary process control is assumed, that is, the unit is not moved across the substrate, but is stationary. Both distributions are shown in normalized form.

As can be seen, the radical concentration has a direct effect on the removed lacquer layer. The radical concentration is highest in the region of the longitudinal center plane of the chamber 22 (see dashed line) and strongly decreases outwards. Thus, the radical concentration on the surface of the substrate 2 greatly differs in a direction transverse to the chamber 22. In order to provide a wider region with a uniform (high) radical concentration, different configurations of the radiation part 18 are proposed.

For example, the configuration according to FIG. 9b shows a tube element 30 with a radiation source 32. The radiation source 32 corresponds to the one previously described. By contrast, the tube element 30 has a flat portion below the opening 21 of the main body 20. This flat portion is arranged so that in a normal orientation it extends horizontally and substantially parallel to a bottom of the main body. This flat portion allows an arrangement of the flat lower side of the tube element 30 parallel to the surface of the substrate 2. This ensures a uniform distance between the tube element 30 and the substrate 2 in this region. This allows a uniform liquid film to be formed between the tube member 30 and the surface of the substrate 2, in such a way that over the width of the flat portion a substantially uniform radical concentration on the surface of the substrate 2 may be formed. The radical concentration is in this case substantially proportional to the incident light intensify reaching the surface of the substrate 2.

Accordingly, the region of a consistently high radical concentration is significantly widened in comparison with the configuration of FIG. 9a, and the region of a high change in the resist layer thickness also widens, leading to an improvement in the efficiency of the device.

FIG. 9c shows a further alternative configuration. Here, again a tube element 30 with a round cross-section is used. The radiation source 32 is again the same as previously described. The tube element 30 is modified such that it has different transmissivity characteristics in different regions. The tube element 30 has a first transmissivity in the region lying within the chamber 22 and another, second transmissivity outside the chamber 22. In particular, the first region has for example the highest possible transmissivity to UV radiation, that is, within the flow chamber substantially all of the UV radiation provided by the radiation source 32 can be introduced into the chamber 22.

On the other hand, the region of the tube element 30 located outside the chamber has a lower transmissivity due to increased absorption or reflection of UV radiation. In particular, the tube element 30 has the lowest transmissivity in the region of the longitudinal center plane, and the transmissivity gradually increases in the direction towards the outlet slits 36. As a result, the radiation intensity of the UV light in a liquid on the surface of the substrate 2 can be adjusted such that a substantially homogeneous radical concentration is achieve over the width of the opening 21 in the main body 20, as shown in the graphs of FIG. 9c. Accordingly, the width of a uniform high resist layer removal is widened.

A corresponding effect can be achieved by the material of the tube element itself, or by a coating or a foil on or adjacent to the respective region of the tube element, in the latter case, a coating or film should preferably be arranged inside the tube element in order to avoid any contamination of the liquid and also to be able to neglect the resistance of the coating to the media being used.

In FIGS. 10a to 10c further configurations of the radiation member 18 are shown, wherein in each case again the housing 14 having chamber 22 and supply line 24 is indicated only schematically. Also again, a substrate 2 is shown schematically. Graphs as shown in FIGS. 9a to 9c are not shown in FIG. 10.

In the configuration according to FIG. 10a, again a single radiation source 32 is provided which is accommodated in a tube element 30. In this configuration, a reflective coating is provided on the portion of the tube element 30 lying inside the chamber 22. This can be designed, for example, as a layer or foil attached to the tube element, which may for example be attached to the inside or the outside. This layer of foil can be fully reflective for the radiation emanating from the radiation source 32 or it can be reflective only in certain wavelength ranges. Hereby, the shape of the reflective coating is designed so that in use, that is, during a media exposure, the radiation exiting from the radiation source over the width of the opening 21 substantially uniformly impinges on the substrate and thus generates a substantially uniform radical concentration in the medium on the substrate surface. For this purpose, the intensity of the radiation emerging from the tube element 30 in the regions adjacent to the outlet slits 36 must be higher than in the region of the longitudinal center plane C.

FIG. 10b shows a further configuration of a reflective coating, wherein here another shape of reflective coating is shown, which in an upper region is flat and in section forms a chord to the round shape of the tube element. Such a shape makes it possible to provide a further radiation source (not shown), in particular in the upper region of the tube element 30 (above the reflective coating). This further radiation source could emit in a different spectral range than the radiation source 32 in order to provide different radiation in the region of the flow channel compared to radiation directed towards the region of the outlet slits 36 and in the direction of the substrate 2. In addition to a homogenization of a radical concentration, a wavelength selection (providing radiation with different primary spectral ranges in different regions of the device, in particular within the chamber 22 and outside the body) could also be provided here.

This could also be achieved via selective reflection characteristics of the reflective coating, which, for example, may allow UV radiation at a wavelength below 200 nm to pass and may substantially reflect UV radiation at a wavelength above 200 nm. Of course, this also applies to the embodiment according to FIG. 10a.

In both cases, that is in the configuration according to FIGS. 10a and 10b, it is also possible to achieve a wavelength selection by arranging additional radiation sources within the body 20 in such a way that they emit from outside into the chamber 22. In this case, the radiation emitted into the chamber 22 could for example be primarily in the range below 200 nm, for example at approximately 185 nm. The radiation emitted out of the chamber 22 via the opening 21 could in particular be primarily in the range above 200 nm, for example at approximately 254 nm. While the radiation below 200 nm may primarily serve to decompose the medium in the flow channel, the radiation above 200 nm may primarily serve to generate radicals.

In addition to a specific spatial distribution of the radiation intensity, an additional wavelength selection could easily be achieved by the above configurations, which provides a different radiation within the flow chamber compared to the radiation emitted out of the chamber in the direction of the substrate 2.

The embodiment according to FIG. 10c may also achieve similar effects. In this embodiment, the radiation part 18 again has a tube element 30. Within the tube element, a first radiation source 32 is provided, which may be of the type described above. Below the first radiation source, a concave, upwardly curved mirror element 200 is provided which substantially reflects radiation emitted by the radiation source 32 back upwards. Below the mirror element 200, an arrangement of different second radiation sources 210 is provided. In particular, seven radiation sources 210 are shown. These radiation sources 210 each emit at least light in the UV range at different intensities. In particular, the intensity increases steadily from the middle one of the radiation sources 210 to the outer ones of the radiation sources 210. That is, the outermost radiation sources 210 emit light with the highest intensity. With this configuration, again a more uniform intensity distribution of light on the substrate surface and thus a more uniform distribution of radicals can be achieved.

In particular, over the width of the opening 21 in the body 20, a substantially uniform radical concentration with the aforementioned advantages can be obtained. In addition, this configuration also allows a certain wavelength selection such that radiation emitted info the flow space can have a different spectral range than radiation emitted out of the opening 21.

For example, the first radiation source may again emit in a range below 200 nm, for example at approximately 185 nm, while the radiation sources 210 for example emit radiation in a range above 200 nm, in particular at approximately 254 nm.

FIGS. 11 and 12 show still further configurations of the radiation part 18. Again, the body 20 with the chamber 22 and the opening 21 and a substrate 2 are schematically shown.

The radiation part 18 in the configuration according to FIG. 11 again has a tube element 30 which is substantially transparent to UV radiation. Within the tube element 30, two radiation sources 220 and 222 are shown. The two radiation sources 220, 222 are arranged one above the other within the tube element 30. The radiation sources 220, 222 are of different types, and in particular emit in different spectral ranges. Hereby, the upper radiation source 220 for example emits radiation primarily in a spectral range below 200 nm, for example at 185 nm, while the lower radiation source 222 emits radiation primarily in a spectral range above 200 nm, for example at 254 nm.

Between the radiation sources 220 and 222, a curved reflector 226 is provided, which is reflective on both sides. The reflector essentially causes a separation of the radiation which is emitted into the flow space from the radiation which is emitted out of the opening 21. The reflector 226 is arranged such that radiation is emitted from both the upper radiation source 220 and the lower radiation source 222 into the end region of the respective flow channels adjacent to the outlet slits 36.

While the radiation below 200 nm, as mentioned above, primarily serves to substantially cause decomposition of the medium in the flow channel, the radiation above 200 nm serves to generate radicals. Since a generation of radicals is already desired in the end region of the flow channel, the configuration as shown is advantageous. The curvature of the downward-pointing region of the reflector 126 may be specifically selected in such a way that again a homogenized intensity distribution of the radiation on the substrate may be achieved, as described above.

In the embodiment according to FIG. 12, once again a tube element 30 with a single radiation source 32 is provided. The tube element 30 again has different absorption characteristics within the chamber 22 and outside the chamber 22. In particular, the region of the tube element 30 lying outside the chamber is substantially transparent to UV radiation, while the region of the tube element 30 located within the chamber 22 absorbs a substantial proportion of the UV radiation. In particular, the absorption characteristics of the region of the tube element arranged within the chamber 22 are adjusted so that primarily UV radiation in the range above 200 nm is absorbed. As can be seen in the illustration according to FIG. 12, the essentially transparent region extends in part into the chamber 22, so that, as mentioned above, UV radiation above 200 nm is also emitted into the end regions of the chamber 22 adjacent to the outlet slits, to provide a desired generation of radicals here.

A respective overlap between the end regions of the chamber 22 and the transparent region of the tube element 30 may be provided over an angular range of up to 20° as seen from the center of the tube element (i.e. a common overlap of the two end regions of up to 40°). This applies not only to this embodiment but also to the other embodiments, in which radiation of different wavelengths is to be selectively emitted into the flow channel and out of the housing. Although not specifically shown, additional means may be provided which cause no UV radiation to be emitted into the flow space from a third region of the tube element facing the flow space. By way of example, the additional means may comprise an element which is opaque to UV radiation and is arranged between the at least one radiation source and the flow space. The third region would preferably face towards the at least one inlet opening, would be arranged symmetrically to the longitudinal center plane and would extend in the circumferential direction of the tube element over not more than 60°.

The operation of the device 1 will now be explained in more detail. It is initially assumed that the configuration according to FIGS. 1 and 2 is present. The operation does not change for the different embodiments.

The application unit 6, in particular the main part 8, is brought into a position adjacent to a substrate 2, in which liquid emerging from the opening 21 does not get onto the substrate 2. Via the media ports 16, a liquid medium, for example, diluted hydrogen peroxide water or ozone water $O_3$—$H_2O$, is introduced into the chamber 22, while at the same time the radiation source 32 is switched on.

In the flow chamber between tube member 36 and inner wall 23 of the chamber 22, a flow of liquid builds up, which is accelerated in the direction of the outlet slits 36. In particular, the velocity of the liquid is accelerated from an overhead region at the end of the supply line 24 to the outlet slits by a factor in the range of 10:1 to 40:1, and preferably by a factor in the range of 15:1 to 25:1, by means of a corresponding change in cross section.

Below the main part 8, a curtain of water forms, which extends uniformly over a substantial part of the length of the main part 8. The radiation emitted by the radiation source 32 decomposes the liquid in the flow channel, that is between the supply line 24 and the outlet slits 36, to destroy unwanted reactive species within the liquid. At the same time, radicals are generated in the liquid by the radiation. These mechanisms primarily take place at different spectral regions of the radiation. For the decomposition, radiation in a spectral range below 200 nm is advantageous, while for radical generation, radiation above 200 nm. In particular at approximately 254 nm, is desired. Without special measures, as described in FIGS. 9 to 11, the radiation emanating from the radiation source 32 in the region of the flow channel and outside the body 20 is substantially the same and generally contains radiation components both above and below 200 nm. Due to the acceleration of the flow in the flow channel, a homogenization of the flow is achieved and thus the liquid curtain is formed homogeneously over a large width.

As described, in the flow channel, on the one hand, the liquid is decomposed and unwanted reactive species are broken up while at the same time radicals, in particular hydroxyl radicals, are generated. These radicals are generated in particular also in the region of the outlet slits 36 so that they can exist for a sufficient time to reach the surface of the substrate 2, when the main part 8 of the application unit 6 is subsequently moved over the substrate 2.

The substrate 2 may for example be a photomask, having residues of lacquer or resist thereon that must be cleaned off. Such a cleaning can be performed over the whole area of the photomask or only over certain areas of the mask. By moving the main part 8 of the application unit 6 over the substrate, the liquid curtain is moved across the substrate 2. The radiation source 32 continuously generates radicals within the liquid, wherein a respective generation of radicals in particular in the region of the outlet slits and below the opening 21 in the body 20 is of importance and the generation of radicals may be concentrated here by certain measures as described in the embodiments. Thus, the liquid is charged with radicals underneath the opening 21 and is particularly effective for the cleaning off of lacquer or resist. Since the radicals rapidly disintegrate, the liquid in regions that are not underneath the opening 21 is not so effective.

The speed of sweeping of the liquid curtain over the substrate can be matched to the required cleaning performance to achieve sufficiently long residence times of the radical-charged liquid on the substrate. When the mask is cleaned accordingly, either the media supply can be stopped and the radiation source switched off, or a next substrate 2 can be treated in a corresponding manner.

The invention has been explained in detail above with reference to preferred embodiments of the invention, without being limited to the specific embodiments. In particular, the different features of the embodiments can be freely combined or exchanged with one another, provided that they are compatible. It should also be mentioned that the combination of biasing elements and spacer pins can also be advantageous, independently of a change in a flow cross-section of the flow space, in order to ensure a constant width of the outlet slits.

The invention claimed is:

1. An apparatus for applying a liquid medium which has been radiated with UV-radiation onto a substrate, the apparatus comprising:
a housing having an elongated chamber, at least one inlet opening, which opens into the elongated chamber, and a slit shaped outlet opening opposite the at least one inlet opening, which extends over a length of the elongated chamber;
a tube element, which extends in a longitudinal direction through the elongated chamber, the tube element being at least partially transparent to UV-radiation, wherein the tube element is arranged in the elongated chamber such that a flow space is formed between the tube element and a wall of the elongated chamber, the flow space being symmetric with respect to a longitudinal center plane of the elongated chamber, the longitudinal center plane dissecting the slit shaped outlet opening in the center, and such that the tube element extends into the slit shaped outlet opening in the housing and thereby forms two outlet slits extending in the longitudinal direction between the tube element and the housing; and
at least one UV-radiation source in the tube element, which is arranged to emit UV-radiation in the direction of the flow space and through the slit shaped outlet opening out of the housing;
wherein the elongated chamber and the tube element each have a substantially circular cross section and a center point of the tube element is offset with respect to a center point of the elongated chamber in the direction of the slit shaped outlet opening such that a longitudinal flow cross section of the flow space between the tube element and the wall reduces continuously from an area adjacent to the at least one inlet opening towards the outlet slits.

2. The apparatus according to claim 1, wherein a ratio of the longitudinal flow cross section of the flow space in the area adjacent to the at least one inlet opening and at the outlet slits is in the range of 10:1 to 40:1.

3. The apparatus according to claim 1, wherein the housing comprises at least one media port, which is fluidly connected to a media distribution channel, wherein the media distribution channel extends adjacent to the elongated chamber in the longitudinal direction within the housing and wherein the at least one inlet opening comprises a plurality of inlet openings and the media distribution channel is fluidly connected to the elongated chamber via the plurality of inlet openings.

4. The apparatus according to claim 3, wherein the at least one media port comprises a plurality of media ports, which are spaced in the longitudinal direction of the media distribution channel.

5. The apparatus according to claim 3, wherein the plurality of inlet openings are evenly spaced in the longitudinal direction of the elongated chamber and are provided at the density in the range of 3/100 mm to 12/100 mm.

6. The apparatus according to claim 3, wherein the plurality of inlet openings are evenly spaced in the longitudinal direction of the elongated chamber and are provided at the density in the range of 4/100 mm to 10/100 mm.

7. The apparatus according to claim 1, wherein the at least one inlet opening comprises a plurality of inlet openings and a sum of the flow cross sections of the plurality of inlet openings is equal to a sum of the flow cross sections of the outlet slits.

8. The apparatus according to claim 1, wherein the apparatus further comprises:
a plurality of spacing elements, which extend between the tube element and the wall of the elongated chamber in order to set a width of the flow space between the tube element and the wall of the elongated chamber; and
a plurality of biasing elements, which bias the wall of the elongated chamber and thus the spacing elements towards the tube element.

9. The apparatus according to claim 8, wherein a pair of the spacing elements is located adjacent to each of the outlet slits and are arranged in the flow space between the at least one inlet opening and the respective outlet slit in a last quarter of the elongated chamber.

10. The apparatus according to claim 8, wherein at least two of the biasing elements are arranged in the longitudinal direction of the elongated chamber in the middle third of a length of the elongated chamber.

11. The apparatus according to claim 8, wherein two of the spacing elements are symmetrically arranged on opposite sides of the longitudinal center plane.

12. The apparatus according to claim 8, wherein the spacing elements are evenly spaced in the longitudinal direction.

13. The apparatus according to claim 8, wherein the biasing elements are arranged transverse to the longitudinal extension of the elongated chamber.

14. The apparatus according to claim 8, wherein the biasing elements extend through the housing to opposite sides of the elongated chamber such that legs of the biasing elements bias resilient portions of the housing towards the elongated chamber to thereby bias the spacing elements towards the tube element.

15. The apparatus according to claim 1, wherein a ratio of the flow cross section of the flow space in the area adjacent to the at least one inlet opening and at the outlet slits is in the range of 15:1 to 25:1.

16. The apparatus according to claim 1, wherein the apparatus further comprises spacing elements extending radially inward from the wall and contacting the tube element for positioning the tube element offset from the elongated chamber, the spacing elements extending at partially through the wall of the housing.

17. The apparatus according to claim 16, wherein the spacing elements comprise:
a plurality of spacers positioned in the longitudinal center plane of the elongated chamber; and
a plurality of adjusting elements positioned outside the longitudinal center plane of the elongated chamber.

18. The apparatus according to claim 17, wherein the position of the adjusting elements is adjustable in the radial direction to change the size of the outlet slits.

19. The apparatus according to claim 17, wherein the apparatus further comprises biasing elements that extend through the housing to opposite sides of the elongated chamber such that legs of the biasing elements bias resilient portions of the housing towards the elongated chamber to thereby bias the adjusting elements towards the tube element.

* * * * *